(12) United States Patent
Thorum

(10) Patent No.: US 7,050,305 B2
(45) Date of Patent: *May 23, 2006

(54) AUTOMOTIVE CONTROL MODULE HOUSING

(75) Inventor: Michael Thorum, Lake Orion, MI (US)

(73) Assignee: Siemens VDO Automotive Corporation, Auburn Hills (*) Notice: Subject to any disclaimer, the term of this patent is extended or adjusted under 35 U.S.C. 154(b) by 0 days.

This patent is subject to a terminal disclaimer.

(21) Appl. No.: 10/990,643

(22) Filed: Nov. 17, 2004

(65) Prior Publication Data

US 2005/0088826 A1  Apr. 28, 2005

Related U.S. Application Data

(62) Division of application No. 10/610,610, filed on Jul. 1, 2003, now Pat. No. 6,881,077.

(60) Provisional application No. 60/397,696, filed on Jul. 22, 2002.

(51) Int. Cl.
*H05K 7/20* (2006.01)

(52) U.S. Cl. .................... 361/719; 174/16.1; 174/16.3; 165/80.3; 165/185

(58) Field of Classification Search ................ 361/676, 361/687–690, 704, 707, 714–720; 174/16.1, 174/17 R, 252; 165/80.3; 220/4.02
See application file for complete search history.

(56) References Cited

U.S. PATENT DOCUMENTS 4,840,286 A * 6/1989 Heberling et al. ......... 220/4.02
4,901,882 A * 2/1990 Goncalves .................. 220/324
5,001,603 A * 3/1991 Villaneuva et al. ......... 361/730
5,373,104 A * 12/1994 Brauer ....................... 174/52.1
5,383,098 A * 1/1995 Ma et al. .................... 361/818
5,548,481 A   8/1996 Salisbury
5,613,237 A * 3/1997 Bent et al. .................. 455/351
5,691,878 A * 11/1997 Ahn et al. ................... 361/674
5,777,844 A   7/1998 Kiefer
5,808,868 A * 9/1998 Drekmeier ................. 361/704
5,814,765 A   9/1998 Bauer
5,944,210 A * 8/1999 Yetter ....................... 220/4.21
5,995,380 A   11/1999 Maue
6,025,991 A * 2/2000 Saito .......................... 361/704
6,099,325 A   8/2000 Parkhill (Continued)

FOREIGN PATENT DOCUMENTS

DE  3603915  8/1987

(Continued)

OTHER PUBLICATIONS

Search Report, dated Oct. 29, 2003.

*Primary Examiner*—Boris Chervinsky

(57) ABSTRACT

An automotive control module includes a plastic housing with a snap-fit metal cover. A printed circuit board is positioned within a cavity formed in the housing, and is attached to the housing with a plurality of fasteners. Resilient tabs are formed on side walls of the housing and grip a cover plate surface to define a snap-fit attachment. Once the cover is attached to the plastic housing, the printed circuit board is enclosed within the cavity between the cover and the housing. The cover includes a plurality of heat transfer fins and/or stamped indentations that form surfaces that are positioned in close proximity to the printed circuit board. The cover utilizes these fins and surfaces to form a heat sink for cooling electronics mounted to the printed circuit board.

25 Claims, 3 Drawing Sheets

U.S. PATENT DOCUMENTS

| | | |
|---|---|---|
| 6,111,760 A | 8/2000 | Nixon |
| 6,162,096 A | 12/2000 | Klaus |
| 6,301,096 B1 * | 10/2001 | Wozniczka ............... 361/674 |
| 6,434,000 B1 * | 8/2002 | Pandolfi .................. 361/685 |

FOREIGN PATENT DOCUMENTS

| | | |
|---|---|---|
| EP | 0 714228 A2 | 5/1996 |
| FR | 2 655 809 A1 | 6/1991 |

* cited by examiner

AUTOMOTIVE CONTROL MODULE HOUSING

CROSS-REFERENCE TO RELATED APPLICATIONS

This application is a divisional of Ser. No. 10/610,610 filed on Jul. 1, 2003 now U.S. Pat. No. 6,881,077, which claims priority to provisional application 60/397,696 filed on Jul. 22, 2002.

BACKGROUND OF THE INVENTION

This invention relates to an automotive control module that includes a unique base plate that is snap-fit to a module housing with an integrated connector to enclose a printed circuit board within the housing, and which simultaneously provides a heat sink to cool the printed circuit board and associated electronics.

Automotive control modules include electronics and software that are used to control various vehicle systems. For example, control modules are used to control engines, automatic transmission shifts, transfer case clutching and declutching, etc. Control modules traditionally have a plastic or steel housing, a printed circuit board (PCB) and associated electronics, and a connector that connects to a vehicle wire harness. The housing is mounted to a vehicle structure with fasteners.

During vehicle operation, the electronics on the PCB generate a significant amount of heat, which must be drawn away from the PCB to prevent over-heating. Traditionally, a heat sink plate has been fastened first to the PCB and then to the housing with a separate housing cover being used enclose the heat sink plate and PCB within the housing. The housing cover is fastened to the housing with rivets or screws to provide a secure attachment.

This control module configuration has several disadvantages. A significant number of components are required, which increases material and manufacturing costs. Further, this configuration is difficult and time consuming to assemble.

Thus, it is desirable to have a simplified automotive control module that can provide sufficient cooling in an enclosed environment for the PCB, as well as overcoming the other above mentioned deficiencies with the prior art.

SUMMARY OF THE INVENTION

An automotive control module includes a housing with a snap-fit cover plate that provides a heat sink and encloses control electronics within the housing. The control electronics are mounted to a printed circuit board (PCB) that is positioned within a cavity formed in the housing. The PCB can have electronics mounted on either or both of the upper or lower surfaces that form the board.

The cover plate is preferably formed from aluminum and includes a generally flat body portion with indentations that form surfaces that are positioned in close proximity to the PCB, but do not actually contact the PCB. The cover plate utilizes these surfaces to form a heat sink for cooling the control electronics mounted to the PCB. Optionally, or in addition to the indentations, the cover plate includes a plurality of fins to improve heat transfer from the PCB to the cover plate.

The housing is preferably formed from a plastic material and includes a bottom portion, a first pair of opposing outer side walls extending upwardly from the bottom portion, and a second pair of opposing outer side walls extending between both of the first pair of opposing outer side walls. The first and second pairs of outer side walls cooperate with the bottom portion to define the cavity. The housing also includes a pair of opposing inner side walls positioned within the cavity in an orientation parallel to and spaced apart from the first pair of opposing outer side walls.

In one disclosed embodiment, resilient tabs are formed on the first pair of opposing outer side walls. The resilient tabs move outwardly from an initial position in response to a snap-fit insertion force applied against the cover plate. The cover plate is pushed against the housing until a bottom surface of the cover plate abuts against a top edge surface of the inner side walls. The resilient tabs then return to their initial position and grip a top surface of the cover plate. Thus, the cover plate is sandwiched between the resilient tabs and the top edge of the inner side walls and serves as both a heat sink and a protective cover.

In one disclosed embodiment, resilient tabs are formed on the opposing inner side walls of the housing and are snap-fit into openings formed within transversely extending edge portions of the cover. In this configuration, the cover includes a base portion with the opposing edge portions being bent approximately ninety degrees such that the edge portions can be inserted between the inner and outer opposing side walls. The tabs gripping bore surfaces that form the openings in the cover to secure the cover to the housing. In this embodiment the cover also serves as both a heat sink and a protective cover.

The subject automotive control module utilizes fewer components, has decreased manufacturing costs, and is easier to assemble than traditional control modules. These and other features of the present invention can be best understood from the following specifications and drawings, the following of which is a brief description.

DETAILED DESCRIPTION OF A PREFERRED EMBODIMENT

An automotive control module 10 generates a control signal 12 that is communicated to a vehicle system 14. The vehicle system 14 can be any of various vehicle systems such as engine management, transmission management, wheel drive management, braking management, or other similar vehicle systems. Preferably, the control module 10 uses the control signal 12 to manage a vehicle transfer case system 14 to achieve all-wheel drive under predetermined conditions.

Figure 1:
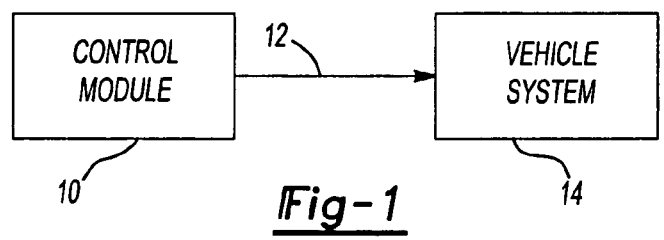
FIG. 1 a schematic view of an automotive control module in communication with a vehicle system.
Figure 2:
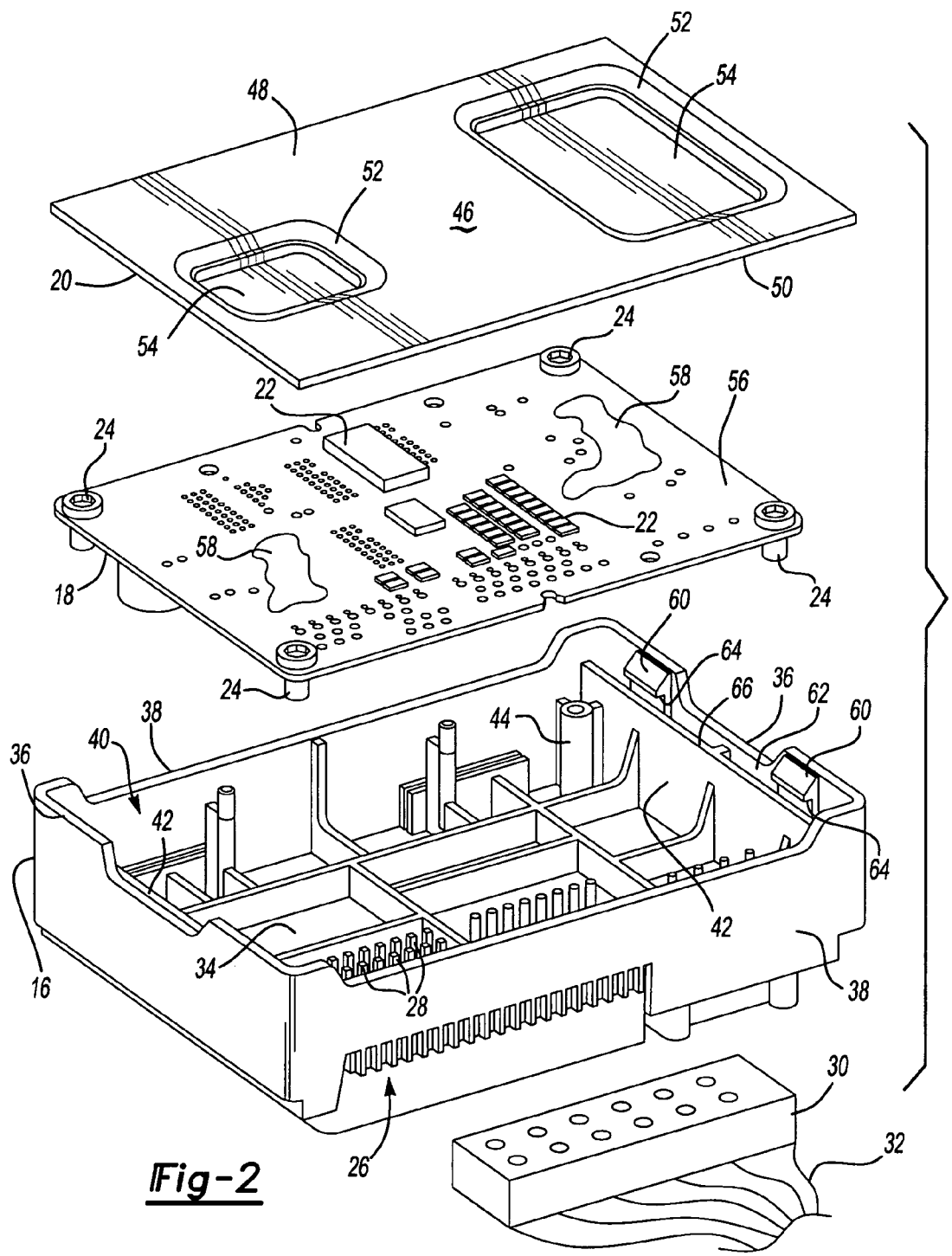
FIG. 2 is an exploded view of an automotive control module incorporating the subject invention.

As shown in FIG. 2, the control module 10 includes a housing 16, a printed circuit board (PCB) 18, and a cover plate 20. The PCB 18 supports a variety of control electronics 22. The PCB 18 is preferably mounted to the housing 16 with a plurality of fasteners 24.

A connector portion 26 is formed within the housing 16. The connector portion 26 cooperates with a plurality of pins 28 that are soldered or press-fit into holes formed in the PCB 18. The connector portion 26 mates with a corresponding connector portion 30 on a vehicle wire harness 32.

The housing 16 is preferably made from a plastic material and includes a base or bottom portion 34, a first pair of opposing outer side walls 36 that extend upwardly from the bottom portion 34, and a second pair of opposing outer side walls 38 that extend upwardly from the bottom portion 34 and interconnect the first pair of opposing outer side walls 36 to define a cavity 40. In other words, the bottom portion 34 and first 36 and second 38 pairs of opposing outer side walls cooperate together to define a generally rectangular housing with an open top.

The housing 16 also includes a pair of inner side walls 42 with one inner side wall 42 being parallel to and spaced apart from a corresponding one of the first pair of opposing outer side walls 36. The PCB 18 is positioned within the cavity 40 between the inner side walls 42. Posts 44 (only one is shown in FIG. 2) are formed within the housing 16 to receive the fasteners 24 that attach the PCB 18 to the housing 16.

The cover plate 20 is preferably made from aluminum or other similar metallic material. The cover plate 20 includes a generally flat body portion 46 with an upper surface 48 and a lower surface 50. In the preferred embodiment, the body portion 46 is formed from a stamped aluminum piece and includes at least one indentation 52. The indentations 52 form a recess on the upper surface 48 of the cover plate 20 and a corresponding extrusion on the lower surface 50. The indentation 52 defines an indentation surface 54 that is non-coplanar with both the upper 48 and lower 50 surfaces of the cover plate 20.

When the cover plate 20 is assembled to the housing 16, the indentation 52 is positioned in close proximity to an upper surface 56 of the PCB 18, but does not actually contact the PCB 18. The cover plate 20 utilizes the indentations 52 to form a heat sink for cooling the control electronics 22 mounted to the PCB 18. A thermal conductive paste 58 is applied the upper surface 56 of the PCB 18 in areas that do not interfere with the electronics 22. The paste 58 facilitates heat transfer from the PCB 18 to the cover plate 20 to cool the electronics 22. When the paste 58 cures, an approximate distance of at least 0.3 millimeters is maintained between the bottom surface of the indentations 52 and the PCB 18. This configuration provides optimal heat transfer without risking electrical shorts that could result if there were direct contact between the cover plate 20 and the PCB 18.

The cover plate 20 is also snap-fit to the housing 16 to enclose the PCB 18 within the housing 16. Thus, the cover plate 20 serves a dual purpose of a heat sink and a protective cover. In the embodiment shown in FIGS. 2-4, housing 16 includes resilient members that grip the cover plate 20 in a snap-fit attachment. These resilient members includes at least one resilient tab 60 on each of the first pair of opposing outer side walls 36. Preferably, a pair of tabs 60 are formed on each of the side walls 36.

Figure 3:
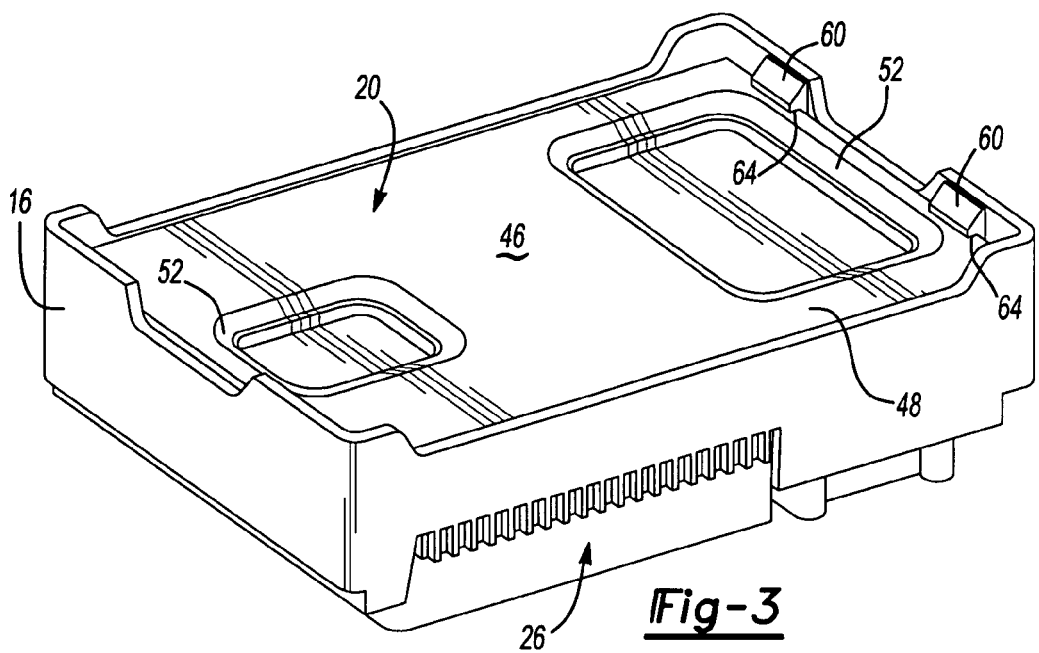
FIG. 3 is a perspective view of the automotive control module of FIG. 2 as assembled.
Figure 4:
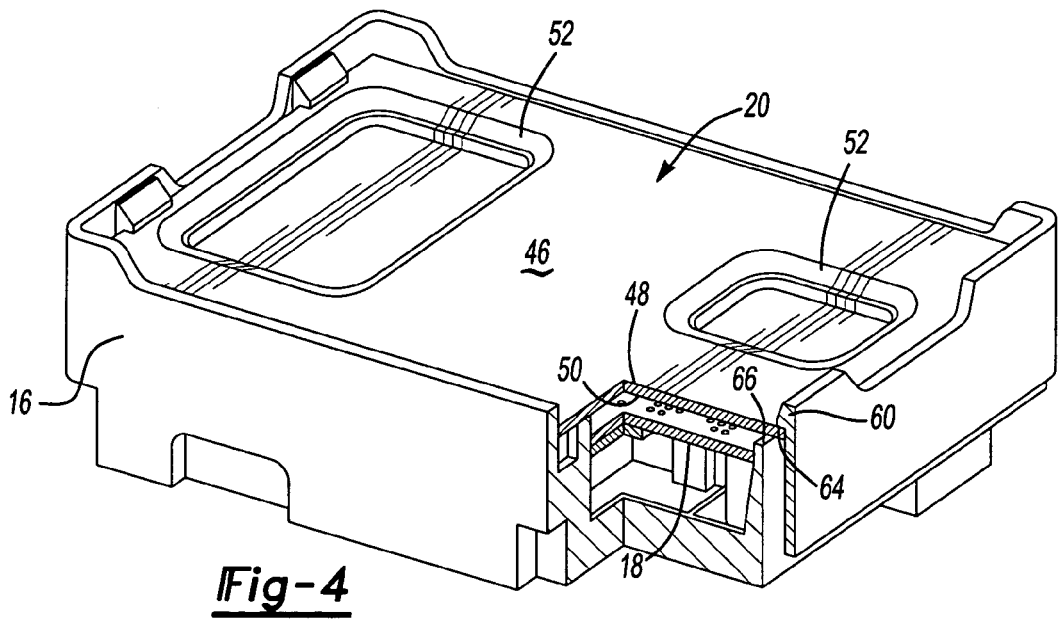
FIG. 4 is a view similar to FIG. 3 but with one corner cut away in cross-section.

The tabs 60 are integrally formed on an inner surface 62 of the side walls 36 and extend to a flexible tip 64. The tabs 60 and a portion of the side walls 36 flex outwardly away from an initial position in response to a snap-in insertion force being applied to the cover plate 20. The cover plate 20 is pushed against the housing 16 until the lower surface 50 of the cover plate 20 abuts against a top edge surface 66 of the inner side walls 42. Once the cover plate 20 is in abutting contact with the inner side walls 42, the tabs 60 and side walls 36 return to their initial position with the flexible tips 64 now being in gripping engagement with the upper surface 48 of the cover plate 20, as shown in FIG. 3. Thus, the cover plate 20 is sandwiched between the tabs 60 and the top edge surface 66 of the inner side walls 42, as shown in FIG. 4.

The cover plate 20 can be easily removed from the housing 16 by exerting an bending force against the outer side walls 36 to reduce the gripping force between the tabs 60 and cover plate 20. The cover plate 20 can then be popped out to provide access to the PCB 18 and associated electronics 22. Thus, the control module 10 can be easily serviced or repaired and the cover plate 20 can be easily re-installed.

Figure 5:
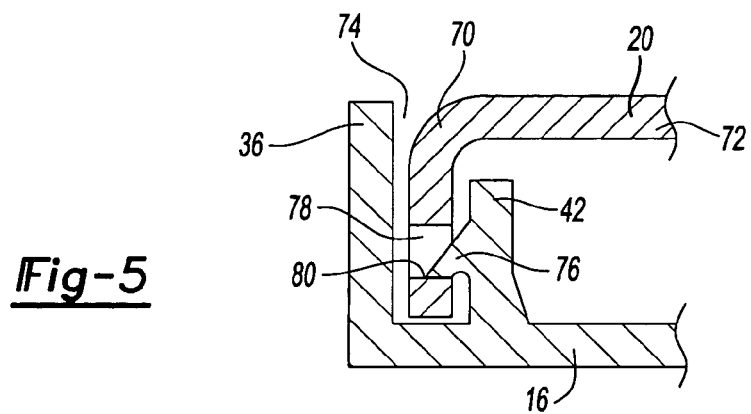
FIG. 5 is a cross-sectional view, partially broken away, of an alternate embodiment.

An alternate snap-fit attachment is shown in FIG. 5. In this embodiment, the cover plate 20 includes a pair of edge portions 70 (only one is shown) that extend transversely to a generally planar main body portion 72. Preferably, the edge portions 70 are bent approximately 90 degrees relative to the body portion 72 and are positioned in a gap 74 formed between the inner side walls 42 and the first pair of opposing outer side walls 36. A plurality of resilient tabs 76 are formed on each of the inner side walls 42. The tabs 76 are received in openings 78 that are formed in the edge portions 70. The tabs 76 and associated wall portions bend away from an initial position as the cover plate 20 is pushed against the housing 16 and return to the initial position once distal ends 80 of the tabs 76 are received in gripping engagement with bore surfaces that define the openings 78.

Figure 6:
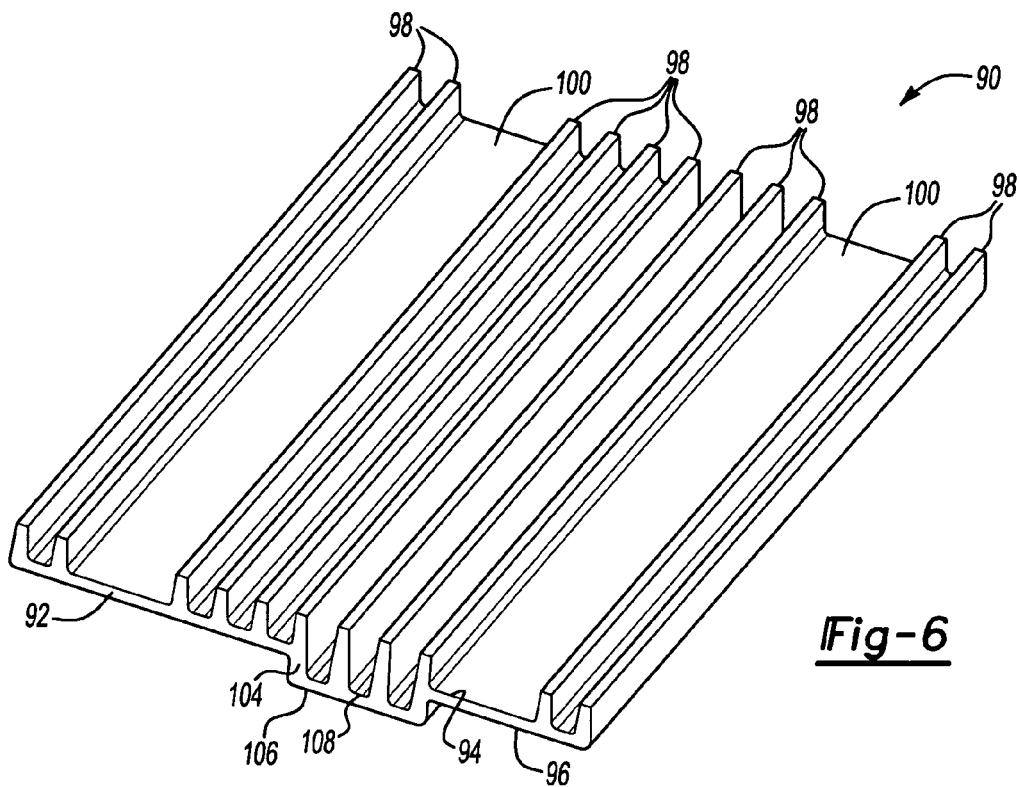
FIG. 6 is a perspective view of an alternate embodiment of a cover plate.
Figure 7:
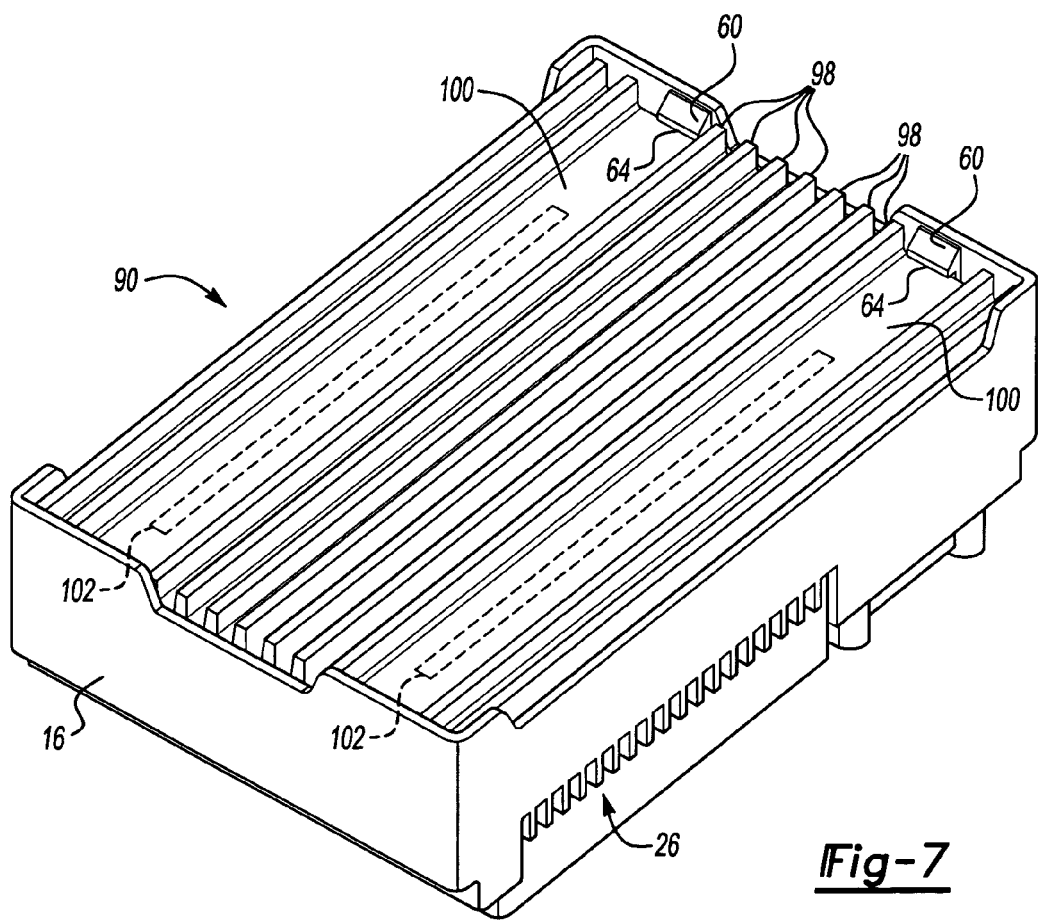
FIG. 7 is a perspective view of the cover plate of FIG. 6 attached to the automotive control module.

An alternate embodiment of a cover 90 is shown in FIGS. 6 and 7. The cover 90 is comprised of a plate body 92 that defines an upper surface 94 and a lower surface 96. A plurality of fins 98 are formed on the upper surface 94 and extend away from the PCB 18. The fins 98 preferably extend in a longitudinal direction along the length of the plate body 92 and are spaced apart from one another in a lateral direction across the width of the plate body 92.

Open spaces 100 on the upper surface 94 are formed such that the fins 98 do not interfere with the tabs 60. The open spaces 100 can extend along the entire length of the plate body 92 as shown in FIG. 6 or shorter fins 102 can be formed at these locations, as shown in FIG. 7.

The cover 90 is preferably made from an extrusion process and includes at least one indentation 104 that defines an indentation lower surface 106 that is positioned in close proximity to the PCB 18. The fins 98 formed on an upper indentation surface 108 are preferably taller than the fins extending from the upper surface 94 of the plate body 92. The combination of the indentation 104 and variable height fins 98 greatly improves heat transfer from the PCB 18 to the cover 90.

The subject provides an automotive control module that requires fewer components, has decreased manufacturing costs, and is easier to assemble than traditional control modules. Also, one of the benefits with the subject invention is that the cover plate 20 serves as both a heat sink and a protective cover for the PCB 18. Further, the assembly process is improved and simplified because the PCB 18 is mounted first to the housing 16 with the cover plate 20 being snap-fit to the housing. Although a preferred embodiment of this invention has been disclosed, a worker of ordinary skill in this art would recognize that certain modifications would come within the scope of this invention. For that reason, the following claims should be studied to determine the true scope and content of this invention.

The invention claimed is:

1. An automotive electronic control module assembly comprising:
   a housing defining an inner cavity wherein said housing includes a pair of outer side walls and a pair of inner side walls spaced apart from and generally parallel to said outer side walls;
   a printed circuit board positioned within said cavity and mounted to said housing;
   a cover plate positioned over said cavity to enclose said printed circuit board within said housing, said plurality of resilient members being formed on at least one of said outer side walls;
   a plurality of resilient members formed on said housing; and
   a retaining surface formed on said cover plate wherein said resilient members engage said retaining surface to securely attach said cover plate to said housing.

2. An assembly as set forth in claim 1 wherein said cover plate is positioned in an overlapping non-contact relationship with said printed circuit board and is spaced apart from said printed circuit board by a gap to form a heat sink.

3. An assembly as set forth in claim 2 wherein said cover plate is comprised of a generally flat sheet portion having an upper surface and a lower surface and includes at least one stamped indentation defining an indentation bottom surface that is non-coplanar with said upper and lower surfaces of said flat sheet portion.

4. An assembly as set forth in claim 3 wherein said gap has a predefined minimum gap height of approximately 0.3 millimeters between said indentation bottom surface and said printed circuit board.

5. An assembly as set forth in claim 2 wherein said housing is comprised of a plastic material and said cover plate is comprised of a metallic material.

6. An assembly as set forth in claim 2 wherein said cover plate is comprised of a base portion with a plurality of fins extending outwardly from said base portion and away from said printed circuit board.

7. An assembly as set forth in claim 5 wherein said metallic material comprises aluminum.

8. An assembly as set forth in claim 1 wherein said cover plate includes an upper portion and an indentation portion forming a heat sink wherein said indentation portion comprises a non-contact surface that is spaced apart from said printed circuit board to form a gap between the non-contact surface and said printed circuit board.

9. An assembly as set forth in claim 8 wherein said upper portion includes a generally flat upper surface and said indentation portion includes a generally flat indentation surface that is non-coplanar to said upper surface.

10. An assembly as set forth in claim 1 wherein said resilient members each comprise a resilient tab having a transversely extending distal tip facing inwardly toward a center of said inner cavity.

11. An assembly as set forth in claim 1 wherein said cover plate includes an upper surface and a lower surface and wherein said resilient members engage said upper surface and said inner side walls engage said lower surface.

12. An assembly as set forth in claim 1 wherein a maximum dimension of said cover plate is less than a distance defined between said pair of outer side walls.

13. An assembly as set forth in claim 1 wherein said housing includes a connector portion having structure for attachment to a vehicle wiring harness.

14. An assembly as set forth in claim 1 wherein the electronic control module assembly generates a vehicle control signal to control a vehicle powertrain system.

15. An automotive electronic control module assembly comprising:
   a plastic housing including a bottom portion, a first pair of opposing outer side walls extending upwardly from said bottom portion, a second pair of opposing outer side walls extending between both of said first pair of opposing outer side walls and cooperating with said bottom portion to define a cavity, and a pair of opposing inner side walls positioned within said cavity in an orientation parallel to and spaced apart from said first pair of opposing outer side walls;
   a printed circuit board positioned within said cavity between said inner side walls;
   a cover positioned over said cavity to enclose said printed circuit board within said housing, said cover having a body portion and including at least one heat transfer member that is positioned closer to said printed circuit board than said body portion to form a heat sink to facilitate heat transfer from said printed circuit board to said cover;
   a plurality of resilient members formed on said housing; and
   a retaining surface formed on said cover wherein said resilient members engage said retaining surface to securely attach said cover to said housing.

16. An assembly as set forth in claim 15 wherein said cover is comprised of a plate having an upper surface and a lower surface and wherein said heat transfer member comprises an indentation defining an indentation bottom surface that is non-coplanar with said upper and lower surfaces of said plate, said indentation bottom surface comprising a non-contact surface that is spaced apart from said printed circuit board by a gap.

17. An assembly as set forth in claim 16 wherein said indentation includes a bottom surface comprising a non-contact surface that is spaced apart from said printed circuit board to define a gap.

18. An assembly as set forth in claim 15 wherein said cover includes an upper surface and a lower surface and wherein said resilient members engage said upper surface and said inner side walls engage said lower surface.

19. A method for assembling an automotive electronic control module comprising the steps of:
   a) forming a plastic housing with a pair of outer side walls and a pair of inner side walls spaced apart and generally parallel to the outer side walls, mounting a printed circuit board within a cavity formed within plastic housing and forming resilient members on the outer side walls; and
   b) enclosing the printed circuit board within the cavity by snapping a cover plate into gripping engagement with the housing to form a secure snap-fit attachment between the housing and the cover plate including gripping an upper surface of the cover plate with the resilient members.

20. A method set forth in claim 19 including unsnapping the cover plate from the housing when necessary to perform service operations.

21. A method set forth in claim 20 wherein step (b) further includes forming the cover plate from aluminum to include a body portion with at least one indentation, and positioning the indentation closer to the printed circuit board than the body portion to form a heat sink that facilitates heat transfer from the printed circuit board to the cover plate.

22. A method as set forth in claim 20 wherein step (b) further includes forming a plurality of fins on an upper surface of the cover plate with the fins extending outwardly from the upper surface and away from the printed circuit board to facilitate heat transfer from the printed circuit board to the cover plate.

23. A method as set forth in claim 21 including spacing the indentation apart from the printed circuit board to form a gap.

24. A method as set forth in claim 19 including forming a connector portion in the plastic housing for connection to a vehicle wire harness.

25. A method as set forth in claim 19 wherein the printed circuit board and associated control electronics comprise a control module and including generating a vehicle control signal from the control module to control a vehicle powertrain system.

* * * * *